US009451670B2

(12) United States Patent
Ingle et al.

(10) Patent No.: US 9,451,670 B2
(45) Date of Patent: Sep. 20, 2016

(54) OPTOELECTRONIC COMPONENT APPARATUS, METHOD FOR PRODUCING AN OPTOELECTRONIC COMPONENT APPARATUS AND METHOD FOR OPERATING AN OPTOELECTRONIC COMPONENT APPARATUS

(71) Applicant: OSRAM OLED GMBH, Regensburg (DE)

(72) Inventors: Andrew Ingle, Allershausen (DE); Kilian Regau, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 14/431,780

(22) PCT Filed: Sep. 26, 2013

(86) PCT No.: PCT/EP2013/070118
§ 371 (c)(1),
(2) Date: Mar. 27, 2015

(87) PCT Pub. No.: WO2014/049080
PCT Pub. Date: Apr. 3, 2014

(65) Prior Publication Data
US 2015/0282273 A1  Oct. 1, 2015

(30) Foreign Application Priority Data

Sep. 28, 2012  (DE) ........................ 10 2012 109 211

(51) Int. Cl.
*H01J 7/24* (2006.01)
*H01J 13/32* (2006.01)
(Continued)

(52) U.S. Cl.
CPC ....... *H05B 33/0896* (2013.01); *H01L 27/3225* (2013.01); *H01L 35/28* (2013.01);
(Continued)

(58) Field of Classification Search
None
See application file for complete search history.

(56) References Cited

U.S. PATENT DOCUMENTS

2010/0207127 A1* 8/2010 Chen .............................. 257/79
2012/0086362 A1* 4/2012 Ota ............................... 315/309
2012/0205679 A1* 8/2012 Hiroki et al. ................. 257/88

FOREIGN PATENT DOCUMENTS

DE   102011004811 A1   8/2012
JP   H09129368 A       5/1997
(Continued)

OTHER PUBLICATIONS

German Search Report based on Application No. 10 2012 109 211.7(5 Pages) dated Jul. 2, 2013 (Reference Purpose Only).
(Continued)

*Primary Examiner* — Anh Tran
(74) *Attorney, Agent, or Firm* — Viering, Jentschura & Partner mbB

(57) ABSTRACT

Various embodiments may relate to an optoelectronic component apparatus, including a carrier, an optoelectronic component and a thermoelectric component on or above the carrier. The optoelectronic component has a planar, optically active region. The thermoelectric component has at least one thermoelectrically sensitive section, wherein the thermoelectrically sensitive section has a first electrical conductivity at a first temperature and a second electrical conductivity at a second temperature, and wherein the thermoelectrically sensitive section is thermally connected to the optoelectronic component in a planar fashion. The thermoelectric component is formed as a temperature sensor and/or thermogenerator.

15 Claims, 7 Drawing Sheets

(51) Int. Cl.
*H01J 17/28* (2006.01)
*H01J 19/74* (2006.01)
*H01J 61/52* (2006.01)
*H05B 33/08* (2006.01)
*H01L 51/52* (2006.01)
*H01L 27/32* (2006.01)
*H01L 35/28* (2006.01)
*H01L 35/34* (2006.01)
*H01L 51/56* (2006.01)

(52) U.S. Cl.
CPC ............ *H01L 35/34* (2013.01); *H01L 51/529* (2013.01); *H01L 51/56* (2013.01); *H01L 2251/5361* (2013.01); *H01L 2251/562* (2013.01)

(56) References Cited

FOREIGN PATENT DOCUMENTS

| | | |
|---|---|---|
| JP | 2006147826 A | 6/2006 |
| JP | 2010272788 A | 12/2010 |
| WO | 2012108097 A1 | 8/2012 |

OTHER PUBLICATIONS

International Search Report based on Application No. PCT/EP2013/070118 (4 Pages and 3 Pages of English translation) dated Apr. 11, 2014.

* cited by examiner

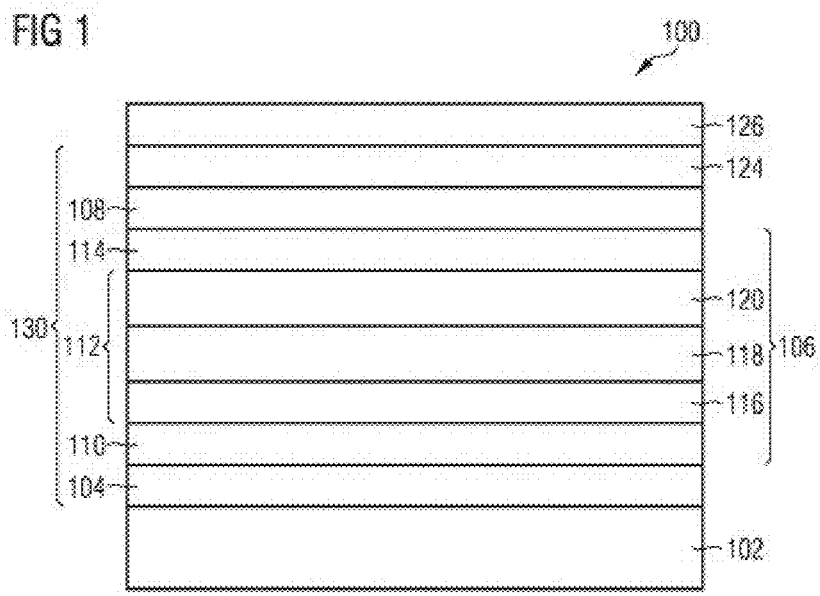

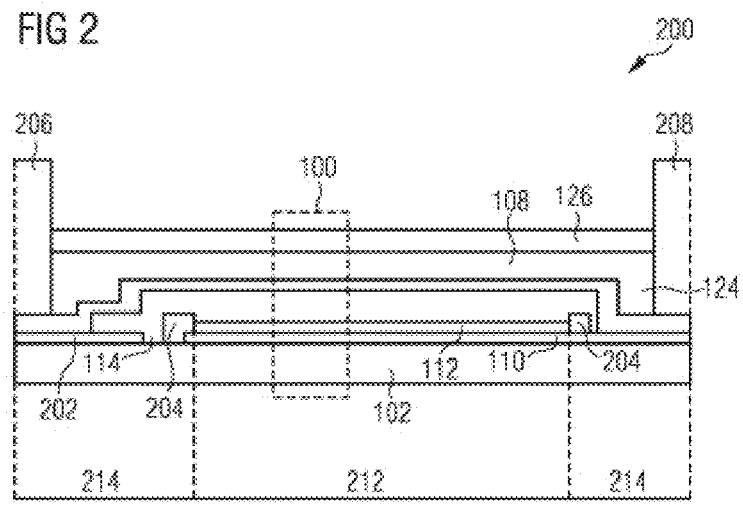

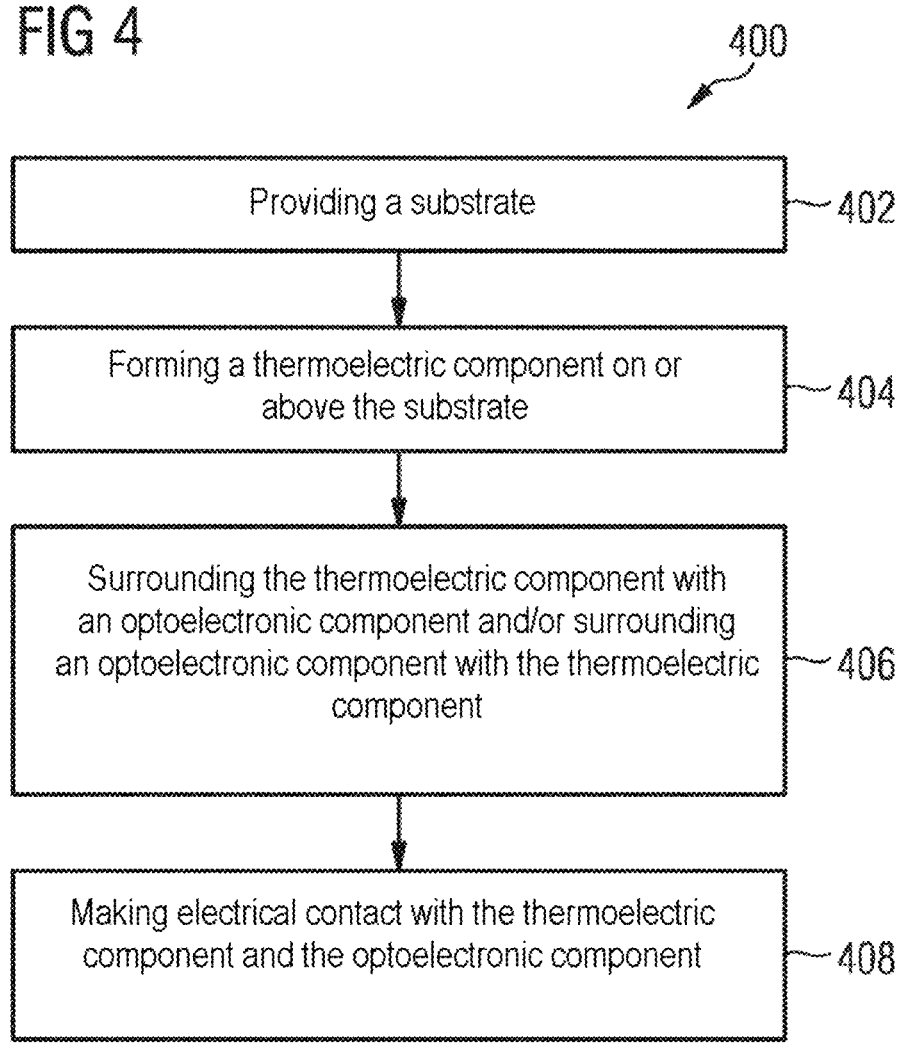

OPTOELECTRONIC COMPONENT APPARATUS, METHOD FOR PRODUCING AN OPTOELECTRONIC COMPONENT APPARATUS AND METHOD FOR OPERATING AN OPTOELECTRONIC COMPONENT APPARATUS

RELATED APPLICATIONS

The present application is a national stage entry according to 35 U.S.C. §371 of PCT application No. PCT/EP2013/070118 filed on Sep. 26, 2013, which claims priority from German application No. 10 2012 109 211.7 filed on Sep. 28, 2012, and is incorporated herein by reference in its entirety.

TECHNICAL FIELD

In various configurations, an optoelectronic component apparatus, a method for producing an optoelectronic component apparatus and a method for operating an optoelectronic component apparatus are provided.

BACKGROUND

An optoelectronic component, for example an organic light emitting diode (OLED), includes at least two electrodes and an organic functional layer system therebetween.

Present-day OLEDs have an aging behavior, i.e. with constant operating current the forward voltage rises as the operating period increases, as a result of which the light intensity decreases.

In order to slow down the fall in light intensity, the operating current could be slowly increased in accordance with the age. For this purpose, however, the luminance should be measured over the entire operating period or, alternatively, a variable approximately proportional to the fall in luminance should be measured. The measurement of the luminance is usually realized by a light sensor, but the measured luminance is influenced by ambient light.

Furthermore, in the case of a fault of an OLED, for example a short circuit (short), local overheating (hotspot) or in incorrect operation, for example polarity reversal or application of an excessively high operating current, the OLED becomes very hot and can become dangerous, for example rupture, or cause a fire or combustion upon contact. Switching off the OLED in a timely manner could afford protection against overheating, but this necessitates measuring the temperature of the OLED over the entire operating period.

One conventional method for measuring the temperature of an OLED involves fixing external temperature sensors, for example temperature probes, in the outer side of an OLED, for example by thermoelements being adhesively bonded on an optically inactive OLED surface by thermally conductive paste. However, this method may locally influence the heat flow at the OLED surface and, for example, pass on a corrupted measured temperature to the regulating device of the operating current of the OLED. At the same time, by this measuring method, the temperature is determined only at points and only at the surface of the OLED. Furthermore, the adhesively bonded temperature element may have a disturbing effect on the overall esthetic impression of the OLED.

Furthermore, coupling a temperature sensor and/or a light sensor to an OLED is susceptible to errors, for example in terms of the accuracy of the adhesive thickness in the case of adhesively bonded sensors and the positioning of the sensors.

SUMMARY

In various configurations, an optoelectronic component apparatus, a method for producing an optoelectronic component apparatus and a method for operating an optoelectronic component apparatus are provided which make it possible to couple a temperature sensor over a large area within an OLED and in direct proximity to the heat generating layer(s) of an OLED.

In the context of this description, an organic substance can be understood to mean a carbon compound which, regardless of the respective state of matter, is present in chemically uniform form and is characterized by characteristic physical and chemical properties. Furthermore, in the context of this description, an inorganic substance can be understood to mean a compound which, regardless of the respective state of matter, is present in chemically uniform form and is characterized by characteristic physical and chemical properties, without carbon or a simple carbon compound. In the context of this description, an organic-inorganic substance (hybrid substance) can be understood to mean a compound which, regardless of the respective state of matter, is present in chemically uniform form and is characterized by characteristic physical and chemical properties, including compound portions which contain carbon and are free of carbon. In the context of this description, the term "substance" encompasses all abovementioned substances, for example an organic substance, an inorganic substance, and/or a hybrid substance. Furthermore, in the context of this description, a substance mixture can be understood to mean something which has constituents consisting of two or more different substances, the constituents of which are very finely dispersed, for example. A substance class should be understood to mean a substance or a substance mixture including one or more organic substance(s), one or more inorganic substance(s) or one or more hybrid substance(s). The term "material" can be used synonymously with the term "substance".

In the context of this description, a first substance or a first substance mixture can be identical to a second substance or a second substance mixture, respectively, if the chemical and physical properties of the first substance or first substance mixture are identical to the chemical and physical properties of the second substance or of the second substance mixture, respectively.

In the context of this description, a first substance or a first substance mixture can be similar to a second substance or a second substance mixture, respectively, if the first substance or the first substance mixture and the second substance or the second substance mixture, respectively, have an approximately identical stoichiometric composition, approximately identical chemical properties and/or approximately identical physical properties with regard to at least one variable, for example the density, the refractive index, the chemical resistance or the like.

In this respect, by way of example, with regard to the stoichiometric composition, crystalline $SiO_2$ (quartz) can be regarded as identical to amorphous $SiO_2$ (silica glass) and as similar to $SiO_x$. However, with regard to the refractive index, crystalline $SiO_2$ can be different than $SiO_x$ or amorphous $SiO_2$. By the addition of additives, for example in the form of dopings, by way of example, amorphous $SiO_2$ may have a refractive index which is identical or similar to that of crystalline $SiO_2$, but can then be different than crystalline $SiO_2$ with regard to the chemical composition and/or the chemical resistance.

The reference variable in terms of which a first substance is similar to a second substance can be indicated explicitly or become apparent from the context, for example from the common properties of a group of substances or substance mixtures.

The connection of a first body to a second body can be positively locking, force locking and/or cohesive. The connections can be embodied as releasable, i.e. reversible. In various configurations, a reversible, close connection can be realized for example as a screw connection, a hook and loop fastener, a clamping/a use of clips.

However, the connections can also be embodied as non-releasable, i.e. irreversible. In this case, a non-releasable connection can be separated only by the connection means being destroyed. In various configurations, an irreversible, close connection can be realized for example as a riveted connection, an adhesively bonded connection or a soldered connection.

In the case of a positively locking connection, the movement of the first body can be restricted by a surface of the second body, wherein the first body moves perpendicularly, i.e. normally, in the direction of the restricting surface of the second body. A pin (first body) in a blind hole (second body) can be restricted in movement for example in five of the six spatial directions. In various configurations, a positively locking connection can be realized for example as a screw connection, a hook and loop fastener, a clamp/a use of clips.

In the case of a force-locking connection, on account of a physical contact of the two bodies under pressure, a static friction can restrict a movement of the first body parallel to the second body. One example of a force-locking connection may be, for example, a bottle cork in a bottle neck or a dowel with an interference fit in a corresponding dowel hole. Furthermore, the force-locking connection can be formed by a press fit between a first body and a second body. By way of example, a diameter of the holding pin can be chosen such that it can still just be inserted into the holding cutout with deformation of the holding pin and/or of the corresponding holding cutout, but can be removed again from the latter only with increased expenditure of force.

In the case of a cohesive connection, the first body can be connected to the second body by atomic and/or molecular forces. Cohesive connections can often be non-releasable connections. In various configurations, a cohesive connection can be realized for example as an adhesively bonded connection, a solder connection, for example of a glass solder, or of a metal solder, a welded connection.

Close fixing can be understood, for example, as close connection of an optoelectronic component to a holder. In various configurations, cohesive fixing can be realized by a close connection means, for example a fusible connector. The quality, i.e. the degree, of the close fixing can be a function of the wetting of a liquefied fusible connector on the first body and/or the second body. Generally, wetting is a behavior of liquids upon contact with the surface of solids. The degree of the close fixing can for example also be designated as wettability or else, depending on the application, solderability, adhesive-bondability or the like. A liquid can wet a surface to different extents depending on the material constitution of the liquid, for example the atomic interaction properties; the material constitution and topographical constitution, for example the roughness, of the wetted surface and the interfacial tension between the wetted surface and the liquid. By Young's equation, the relationship can be related via the contact angle and thus make the latter the measure of wettability. In this case, the greater the contact angle, the lower the wettability.

In the context of this description, a close connection means, for example a fusible connector, can be a substance or substance mixture for cohesively connecting two bodies, for example an electronic component to a holder.

In various configurations, a fusible connector can be a substance which is dimensionally stable at room temperature up to approximately 80° C. and which, for connecting the bodies, firstly is liquefied and then is solidified again. In this case, the fusible connector can be brought into contact with the two bodies as early as before liquefaction or only in the formable, for example liquid, state. In various configurations, the fusible connector can be liquefied in a convection furnace, a reflow furnace or by local heating, for example by laser irradiation or an electric current. In various configurations, the fusible connector may include a plastic, for example a synthetic resin, and/or a metal, for example a solder. In various configurations, the solder may include an alloy. In various configurations, the solder may include one of the following substances: lead, tin, zinc, copper, silver, aluminum, silicon and/or glass and/or organic or inorganic additives.

In the context of this description, an electronic component can be understood to mean a component which concerns the control, regulation or amplification of an electric current, for example by the use of semiconductor components. An electronic component can be for example a diode, a transistor, a thermogenerator, an integrated circuit or a thyristor.

In the context of this description, an optoelectronic component can be understood to mean an embodiment of an electronic component, wherein the optoelectronic component includes an optically active region.

In the context of this description, an optically active region of an optoelectronic component can be understood to mean that region of an optoelectronic component which can absorb electromagnetic radiation and form a photocurrent therefrom or can emit electromagnetic radiation by a voltage applied to the optically active regions.

In the context of this description, providing electromagnetic radiation can be understood to mean emitting electromagnetic radiation.

In the context of this description, taking up electromagnetic radiation can be understood to mean absorbing electromagnetic radiation.

An optoelectronic component whose optically active region includes two planar, optically active sides can be embodied for example as transparent, for example as a transparent organic light emitting diode. However, the optically active region may also include one planar, optically active side and one planar, optically inactive side, for example an organic light emitting diode designed as a top emitter or bottom emitter.

In various embodiments, an optoelectronic component which emits electromagnetic radiation can be for example a semiconductor component which emits electromagnetic radiation, and/or can be embodied as a diode which emits electromagnetic radiation, as an organic diode which emits electromagnetic radiation, as a transistor which emits electromagnetic radiation or as an organic transistor which emits electromagnetic radiation. The radiation can be light in the visible range, UV light and/or infrared light, for example. In this connection, the component which emits electromagnetic radiation can be embodied for example as a light emitting diode (LED), as an organic light emitting diode (OLED), as a light emitting transistor or as an organic light emitting transistor. In various embodiments, the light emitting component can be part of an integrated circuit. Furthermore, a plurality of light emitting components can be provided, for example in a manner accommodated in a common housing.

In various configurations, an organic optoelectronic component, for example an organic light emitting diode (OLED), an organic photovoltaic installation, for example an organic solar cell, in the organic functional layer system may include or be formed from an organic substance or an organic substance mixture which is designed for example for providing electromagnetic radiation from an electric current provided or for providing an electric current from electromagnetic radiation provided.

In the context of this description, a thermoelectric component can be understood to mean a component which can form an electrical potential difference by a temperature difference or a temperature difference by an electrical potential difference, wherein the potential difference can lead to formation of an electric current. The relationship between temperature and electricity can be described physically by the Seebeck effect, Peltier effect or Thomson effect.

In various embodiments, an optoelectronic component apparatus is provided, the optoelectronic component apparatus including: a carrier, an optoelectronic component and a thermoelectric component on or above the carrier; wherein the optoelectronic component has a planar, optically active region; wherein the thermoelectric component has at least one thermoelectrically sensitive section; wherein the thermoelectrically sensitive section has a first electrical conductivity at a first temperature and a second electrical conductivity at a second temperature; and wherein the thermoelectrically sensitive section is thermally connected to the optoelectronic component in a planar fashion.

In one configuration of the optoelectronic component apparatus, the optoelectronic component can have an optically active region and an optically inactive region.

In one configuration of the optoelectronic component apparatus, the optically active region can have an optically inactive side.

In one configuration of the optoelectronic component apparatus, the optically inactive region can at least partly surround the optically active region, for example in a ring-shaped fashion, in a planar fashion alongside one another and/or laterally.

In one configuration of the optoelectronic component apparatus, the optically active region can be formed in a planar fashion.

In one configuration of the optoelectronic component apparatus, at least the thermoelectrically sensitive section can be cohesively connected to at least one region of the optoelectronic component.

In one configuration of the optoelectronic component apparatus, the thermoelectrically sensitive section can be formed as a polygon progression.

In one configuration of the optoelectronic component apparatus, the polygon progression can be formed in such a way that the thermoelectrically sensitive section spans a planar, thermoelectrically sensitive area, for example non-linearly.

In one configuration of the optoelectronic component apparatus, the polygon progression in the thermoelectrically sensitive area can at least partly have or form one of the following geometrical shapes: a spiral, a meander, a fan, a fold or the like.

In one configuration of the optoelectronic component apparatus, the planar dimension of the thermoelectrically sensitive area can be greater than approximately half of the planar dimension of the optically active region, for example greater than approximately 70%. The thermoelectrically sensitive area can be greater than the geometric dimension of the thermoelectrically sensitive polygon progression since the thermoelectrically sensitive region is also thermally influenced by regions of the optoelectronic component which have no direct, physical contact with the thermoelectrically sensitive polygon progression.

In one configuration of the optoelectronic component apparatus, the thermoelectrically sensitive section may include or be formed by a substance whose electrical conductivity is dependent on the temperature.

In one configuration of the optoelectronic component apparatus, the thermoelectrically sensitive section can be formed as a thermistor.

In one configuration of the optoelectronic component apparatus, the thermoelectrically sensitive section can be formed in such a way that the electrical resistance of the thermoelectrically sensitive section changes continuously as the temperature changes.

In one configuration of the optoelectronic component apparatus, the thermoelectrically sensitive section can be formed in such a way that the electrical resistance of the thermoelectrically sensitive section changes monotonically as the temperature changes.

In one configuration of the optoelectronic component apparatus, the thermoelectrically sensitive section can be formed in such a way that the electrical resistance of the thermoelectrically sensitive section changes linearly or exponentially as the temperature changes.

In one configuration of the optoelectronic component apparatus, the thermoelectrically sensitive section can be formed in such a way that the electrical resistance of the thermoelectrically sensitive section rises as the temperature increases. In other words: the thermoelectrically sensitive section can be formed as a PTC thermistor.

In one configuration of the optoelectronic component apparatus, the thermoelectrically sensitive section can be formed in such a way that the electrical resistance of the thermoelectrically sensitive section falls as the temperature increases. In other words: the thermoelectrically sensitive section can be formed as an NTC thermistor.

In one configuration of the optoelectronic component apparatus, the thermoelectrically sensitive section may include or be formed from one of the following substances and mixtures and alloys thereof: silicon, a bismuth chalcogenide, for example $Bi_2Te_3$, $Bi_2Se_3$; a lead telluride, for example PbTe, doped $PbTe_{1-x}B_x$ (B=selenium, sodium and/or thallium); a silicide; a silicon-germanium alloy; an inorganic clathrate, for example $A_xB_yC_{46-y}$ (type I), $A_xB_yC_{136-y}$ (type II) where B, C=atoms of groups III and IV, for example $Ba_8Ga_{16}Ge_{30}$, $Ba_8Ga_{16}Si_{30}$; a magnesium group IV composite material, for example $Mg_2B^{IV}$ where $B^{IV}$=Si, Ge, Sn, for example doped $Mg_2Si_{1-x}Sn_x$; a skutterudite, for example $LM_4X_{12}$ where L is a rare earth metal, M is a transition metal, X is a metalloid, an element of group V or a pnictogen (element of the nitrogen class, for example phosphorus, antimony or arsenic), for example $(Co,Ni,Fe)(P,Sb,As)_3$; a semiconducting metal oxide, for example a thermoelectric oxide composite material, for example a homologous oxide of the form $(SrTiO_3)_n(SrO)_m$ of the Ruddleson-Popper phase, $Na_xCoO_2$; or an electrically conductive, organic material.

In one configuration of the optoelectronic component apparatus, the thermoelectrically sensitive section may include a varistor or be formed as a varistor.

In one configuration of the optoelectronic component apparatus, the varistor may include a matrix in which particles are distributed, wherein the particles have a varistor property.

In one configuration of the optoelectronic component apparatus, the particles can be distributed in the matrix in such a way that a closed current path is formed through the matrix.

In one configuration of the optoelectronic component apparatus, the particles may include or be formed from, as substance, one of the following substances: zinc oxide, silicon carbide or the like.

In one configuration of the optoelectronic component apparatus, the thermoelectrically sensitive section can be formed on or above a cover, for example a glass film, a metal film or a plastics film.

In one configuration of the optoelectronic component apparatus, the cover can be applied, for example adhesively bonded and/or laminated, onto or above the optoelectronic component.

In one configuration of the optoelectronic component apparatus, the thermoelectrically sensitive section can be formed on at least one planar surface of the cover in such a way that the thermoelectrically sensitive section faces and/or faces away from the optoelectronic component.

In one configuration of the optoelectronic component apparatus, the thermoelectrically sensitive section can be formed on the carrier and/or the cover in such a way that the thermoelectrically sensitive section can be formed partly or completely as a part of the carrier and/or of the cover of the optoelectronic component.

In one configuration of the optoelectronic component apparatus, at least one part of the thermoelectrically sensitive section of the thermoelectric component can be formed below or on the optoelectronic component.

In one configuration of the optoelectronic component apparatus, the thermoelectrically sensitive section of the thermoelectric component can be formed alongside the optoelectronic component.

In one configuration of the optoelectronic component apparatus, the optoelectronic component apparatus can be designed in such a way that the thermoelectric component and the optoelectronic component have a common contact pad.

In one configuration of the optoelectronic component apparatus, the thermoelectrically sensitive section can be formed partly or completely alongside the optoelectronic component.

In one configuration of the optoelectronic component apparatus, the optoelectronic component apparatus may furthermore include a control unit, for electrically driving the optoelectronic component, wherein the optoelectronic properties of the optoelectronic component are a function of the electrical conductivity of the thermoelectrically sensitive section.

In one configuration of the optoelectronic component apparatus, the control unit of the optoelectronic component can be designed in such a way that the aging-dictated change in the color locus of the optoelectronic component is compensated for by the operating current of the optoelectronic component.

In one configuration of the optoelectronic component apparatus, the control unit can be designed in such a way that the operating current of the optoelectronic component has a pulse width modulation.

In one configuration of the optoelectronic component apparatus, the control unit of the optoelectronic component can be designed in such a way that the operating current of the optoelectronic component has a phase chopping control or a phase gating control of the optoelectronic component.

In one configuration of the optoelectronic component apparatus, the control unit of the optoelectronic component can be designed as a dimmer of the operating current of the optoelectronic component.

In one configuration of the optoelectronic component apparatus, the optoelectronic component can be designed as an organic light emitting diode or an organic solar cell.

In one configuration of the optoelectronic component apparatus, the optoelectronic component apparatus can be designed as a temperature-regulated optoelectronic component, for example a temperature-regulated organic light emitting diode.

In various embodiments, the method for producing an optoelectronic component apparatus is provided, the method including: forming an optoelectronic component and forming a thermoelectric component; wherein forming the thermoelectric component includes forming a first contact pad, forming a second contact pad and forming at least one thermoelectrically sensitive section, wherein the thermoelectrically sensitive section is formed in such a way that the first contact pad is electrically connected to the second electrical contact pad; and that the thermoelectric sensitive section at least partly surrounds the optoelectronic component.

In one configuration of the method, forming the optoelectronic component may include forming an optically active region and forming an optically inactive region.

In one configuration of the method, the optically active region can be formed in such a way that the optically active region has an optically inactive side.

In one configuration of the method, the optically inactive region can be formed in such a way that the optically inactive region at least partly surrounds the optically active region, for example in a ring-shaped fashion, in a planar fashion alongside one another and/or laterally.

In one configuration of the method, the optically active region can be formed in a planar fashion.

In one configuration of the method, at least the thermoelectrically sensitive section can be cohesively connected to at least one region of the optoelectronic component.

In one configuration of the method, the thermoelectric sensitive section can be formed as a polygon progression.

In one configuration of the method, the polygon progression can be formed in such a way that the thermoelectrically sensitive section spans a planar, thermoelectrically sensitive area.

In one configuration of the method, the polygon progression in the thermoelectrically sensitive area can at least partly have one of the following geometrical shapes: a spiral, a meander, a fan.

In one configuration of the method, the planar dimension of the thermoelectrically sensitive area can be greater than approximately half of the planar dimension of the optically active region.

In one configuration of the method, the thermoelectrically sensitive section may include or be formed from one of the following substances and mixtures and alloys thereof: silicon, a bismuth chalcogenide, for example $Bi_2Te_3$, $Bi_2Se_3$; a lead telluride, for example PbTe, doped $PbTe_{1-x}B_x$ (B=selenium, sodium and/or thallium); a silicide; a silicon-germanium alloy; an inorganic clathrate, for example $A_xB_yC_{46-y}$ (type I), $A_xB_yC_{136-y}$ (type II) where B, C=atoms of groups III and IV, for example $Ba_8Ga_{16}Ge_{30}$, $Ba_8Ga_{16}Si_{30}$; a magnesium group IV composite material, for example $Mg_2B^{IV}$ where $B^{IV}$=Si, Ge, Sn, for example doped $Mg_2Si_{1-x}Sn_x$; a skutterudite, for example $LM_4X_{12}$ where L is a rare earth metal, M is a transition metal, X is a metalloid, an element of group V or a pnictogen (element of the nitrogen class, for example phosphorus, antimony or arsenic), for example $(Co,Ni,Fe) (P,Sb,As)_3$; a semiconducting metal oxide, for example a thermoelectric oxide composite material, for example a homologous oxide of the form $(SrTiO_3)_x(SrO)_m$ of the Ruddleson-Popper phase, $Na_xCoO_2$; or an electrically conductive, organic material.

In one configuration of the method, the thermoelectric sensitive section may include or be formed from a substance whose electrical conductivity is dependent on the temperature.

In one configuration of the method, the thermoelectrically sensitive section can be formed in such a way that the electrical resistance of the thermoelectrically sensitive section changes continuously as the temperature changes.

In one configuration of the method, the thermoelectrically sensitive section can be formed in such a way that the electrical resistance of the thermoelectrically sensitive section changes monotonically as the temperature changes.

In one configuration of the method, the thermoelectrically sensitive section can be formed in such a way that the electrical resistance of the thermoelectrically sensitive section changes linearly or exponentially as the temperature changes.

In one configuration of the method, the thermoelectrically sensitive section can be formed in such a way that the electrical resistance rises as the temperature increases.

In one configuration of the method, the thermoelectrically sensitive section can be formed in such a way that the electrical resistance falls as the temperature increases.

In one configuration of the method, forming the thermoelectrically sensitive section may include forming a varistor or the thermoelectrically sensitive section can be formed as a varistor.

In one configuration of the method, forming the varistor may include applying a matrix, wherein particles are distributed in the matrix, wherein the particles have a varistor property.

In one configuration of the method, the particles can be distributed in the matrix in such a way that a closed current path is formed through the matrix.

In one configuration of the method, the particles may include or be formed from, as substance, one of the following substances: zinc oxide, silicon carbide or the like.

In one configuration of the method, the thermoelectrically sensitive section can be formed on or above a cover or a carrier of the optoelectronic component, for example a glass film, a metal film or a plastics film.

In one configuration of the method, the cover can be applied, for example adhesively bonded and/or laminated, onto or above the optoelectronic component; and the optoelectronic component can be formed on or above the carrier.

In one configuration of the method, a thermoelectrically sensitive section can be formed on at least one planar surface of the cover in such a way that the thermoelectrically sensitive section faces and/or faces away from the optoelectronic component.

In one configuration of the method, the thermoelectrically sensitive section can be formed on the carrier and/or the cover in such a way that the thermoelectrically sensitive section is formed partly or completely as a part of the carrier and/or of the cover of the optoelectronic component.

In one configuration of the method, at least one part of the thermoelectrically sensitive section of the thermoelectric component can be formed below and/or on or above the optoelectronic component.

In one configuration of the method, the thermoelectrically sensitive section of the thermoelectric component can be formed alongside the optoelectronic component.

In one configuration of the method, the optoelectronic component apparatus can be designed in such a way that the thermoelectric component and the optoelectronic component have a common contact pad.

In one configuration of the method, the thermoelectrically sensitive section can be formed partly or completely alongside the optoelectronic component.

In one configuration of the method, the method may furthermore include forming a control unit, wherein the control unit is designed for electrically driving the optoelectronic component, wherein the optoelectronic properties of the optoelectronic component are a function of the electrical conductivity of the thermoelectrically sensitive section.

In one configuration of the method, the control unit of the optoelectronic component can be designed in such a way that the aging-dictated change in the color locus of the optoelectronic component is compensated for by the operating current of the optoelectronic component.

In one configuration of the method, the control unit can be designed in such a way that the operating current of the optoelectronic component has a pulse width modulation.

In one configuration of the method, the control unit of the optoelectronic component can be designed in such a way that the operating current of the optoelectronic component has a phase chopping control or a phase gating control of the optoelectronic component.

In one configuration of the method, the control unit of the optoelectronic component can be designed as a dimmer of the operating current of the optoelectronic component.

In one configuration of the method, the optoelectronic component can be designed as an organic light emitting diode or an organic solar cell.

In one configuration of the method, the optoelectronic component apparatus can be designed as a temperature-regulated optoelectronic component, for example a temperature-regulated organic light emitting diode.

In various embodiments, a method for operating an optoelectronic component apparatus is provided, the method including: determining an average surface temperature of a planar, optoelectronic component; and changing at least one optoelectric property of the optoelectronic component; wherein the at least one optoelectronic property is changed in such a way that the surface temperature of the optoelectronic component is altered from a first temperature value toward a second temperature value.

In one configuration of the method, the optoelectronic component apparatus can be designed in accordance with one of the configurations described above.

In one configuration of the method, changing the optoelectronic properties can be designed as adapting the optoelectronic properties toward an optoelectronic target property.

In one configuration of the method, changing the optoelectronic properties may include changing the operating current of the optoelectronic component.

In one configuration of the method, changing the operating current of the optoelectronic component may include increasing the current intensity.

In one configuration of the method, changing the operating current of the optoelectronic component may include reducing the current intensity.

In one configuration of the method, changing the optoelectronic properties can as changing an optical component in the beam path of the optoelectronic component, for example inserting a diaphragm, a filter or an optical lens; or as changing the incidence.

In one configuration of the method, the determined average surface temperature of the planar, optoelectronic component can be correlated with a further, optoelectronic property, for example the intensity of electromagnetic radiation provided, the voltage drop across the optoelectronic component or the like.

In one configuration of the method, the first temperature value can be greater than the second temperature value.

In one configuration of the method, the second temperature value can be greater than the first temperature value.

In one configuration of the method, changing the optoelectronic properties can be designed as deactivating the optoelectronic component apparatus, for example in the event of a critical temperature value being exceeded and/or undershot. Deactivating the optoelectronic component apparatus in the event of a critical temperature value being undershot can be carried out for example upon an interruption of a cooling chain or a reduction of the electrical conductivity of layers of the optoelectronic component apparatus. Deactivating the optoelectronic component apparatus can be carried out for example in the event of the optoelectronic component apparatus being overheated.

In one configuration of the method, the critical temperature value can have an absolute value in a range of approximately 0° C. to approximately 150° C.

In one configuration of the method, changing the optoelectronic properties can be designed as compensating for an aging-dictated change in the optoelectronic properties of the optoelectronic component, for example as compensating for the color locus of electromagnetic radiation provided and/or taken up.

In one configuration of the method, changing the operating current may include a pulse width modulation.

In one configuration of the method, changing the operating current may include a phase chopping control or a phase gating control of the optoelectronic component.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 1 shows a schematic cross-sectional view of an optoelectronic component, in accordance with various embodiments;

FIG. 2 shows a schematic cross-sectional view of an optoelectronic component, in accordance with various embodiments;

FIG. 4 shows a diagram of one method for producing an optoelectronic component apparatus, in accordance with various embodiments;

DETAILED DESCRIPTION

Figure 3A:
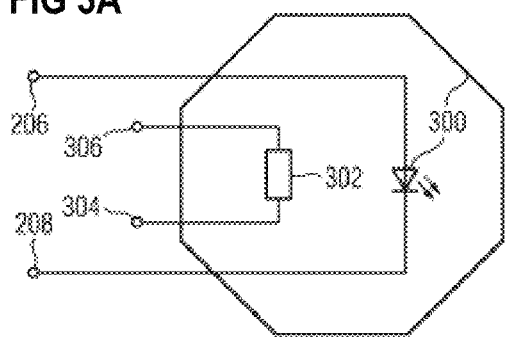
FIGS. 3A to 3C show schematic illustrations concerning an optoelectronic component apparatus, in accordance with various embodiments.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

FIG. 1 shows a schematic cross-sectional view of an optoelectronic component, in accordance with various embodiments.

The optoelectronic component 100, for example an electronic component 100 which provides electromagnetic radiation, for example a light emitting component 100, for example in the form of an organic light emitting diode 100, can have a carrier 102. The carrier 102 can serve for example as a carrier element for electronic elements or layers, for example light emitting elements. By way of example, the carrier 102 may include or be formed from glass, quartz and/or a semiconductor material or any other suitable substance. Furthermore, the carrier 102 may include or be formed from a plastics film or a laminate including one or including a plurality of plastics films. The plastic may include or be formed from one or more polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN). The carrier 102 may include one or more of the substances mentioned above. The carrier 102 may include or be formed from a metal or a metal compound, for example copper, silver, gold, platinum or the like. A carrier 102 including a metal or a metal compound can also be embodied as a metal film or a metal-coated film.

The carrier 102 can be embodied as translucent or even transparent.

In various embodiments, the term "translucent" or "translucent layer" can be understood to mean that a layer is transmissive to light, for example to the light generated by the light emitting component, for example in one or more wavelength ranges, for example to light in a wavelength range of visible light (for example at least in a partial range of the wavelength range of from 380 nm to 780 nm). By way of example, in various embodiments, the term "translucent layer" should be understood to mean that substantially the entire quantity of light coupled into a structure (for example a layer) is also coupled out from the structure (for example layer), wherein part of the light can be scattered in this case.

In various embodiments, the term "transparent" or "transparent layer" can be understood to mean that a layer is transmissive to light (for example at least in a partial range of the wavelength range of from 380 nm to 780 nm), wherein light coupled into a structure (for example a layer) is also coupled out from the structure (for example layer) substantially without scattering or light conversion. Consequently, in various embodiments, "transparent" should be regarded as a special case of "translucent".

For the case where, for example, a light emitting monochromatic or emission spectrum-limited electronic component is intended to be provided, it suffices for the optically translucent layer structure to be translucent at least in a partial range of the wavelength range of the desired monochromatic light or for the limited emission spectrum.

In various embodiments, the organic light emitting diode 100 (or else the light emitting components in accordance with the embodiments that have been described above or will be described below) can be designed as a so-called top and bottom emitter. A top and/or bottom emitter can also be designated as an optically transparent component, for example a transparent organic light emitting diode.

In various embodiments, a barrier layer 104 can optionally be arranged on or above the carrier 102. The barrier layer 104 may include or consist of one or more of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. Furthermore, in various embodiments, the barrier layer 104 can have a layer thickness in a range of approximately 0.1 nm (one atomic layer) to approximately 5000 nm, for example a layer thickness in a range of approximately 10 nm to approximately 200 nm, for example a layer thickness of approximately 40 nm.

An electrically active region 106 of the light emitting component 100 can be arranged on or above the barrier layer 104. The electrically active region 106 can be understood as that region of the light emitting component 100 in which an electric current for the operation of the light emitting component 100 flows. In various embodiments, the electrically active region 106 may include a first electrode 110, a second electrode 114 and an organic functional layer structure 112, as are explained in even greater detail below.

In this regard, in various embodiments, the first electrode 110 (for example in the form of a first electrode layer 110) can be applied on or above the barrier layer 104 (or, if the barrier layer 104 is not present, on or above the carrier 102). The first electrode 110 (also designated hereinafter as bottom electrode 110) can be formed from an electrically conductive substance, such as, for example, a metal or a transparent conductive oxide (TCO) or a layer stack including a plurality of layers of the same metal or different metals and/or the same TCO or different TCOs. Transparent conductive oxides are transparent conductive substances, for example metal oxides, such as, for example, zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, $AlZnO$, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped.

In various embodiments, the first electrode 110 may include a metal; for example Ag, Pt, Au, Mg, Al, Ba, In, Ca, Sm or Li, and compounds, combinations or alloys of these materials.

In various embodiments, the first electrode 110 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

In various embodiments, the first electrode 110 may include one or a plurality of the following substances as an alternative or in addition to the abovementioned substances: networks composed of metallic nanowires and nanoparticles, for example composed of Ag; networks composed of carbon nanotubes; graphene particles and graphene layers; networks composed of semiconducting nanowires.

Furthermore, the first electrode 110 may include electrically conductive polymers or transition metal oxides or transparent electrically conductive oxides.

In various embodiments, the first electrode 110 and the carrier 102 can be formed as translucent or transparent. In the case where the first electrode 110 includes or is formed from a metal, the first electrode 110 can have for example a layer thickness of less than or equal to approximately 25 nm, for example a layer thickness of less than or equal to approximately 20 nm, for example a layer thickness of less than or equal to approximately 18 nm. Furthermore, the first electrode 110 can have for example a layer thickness of greater than or equal to approximately 10 nm, for example a layer thickness of greater than or equal to approximately 15 nm. In various embodiments, the first electrode 110 can have a layer thickness in a range of approximately 10 nm to approximately 25 nm, for example a layer thickness in a range of approximately 10 nm to approximately 18 nm, for example a layer thickness in a range of approximately 15 nm to approximately 18 nm.

Furthermore, for the case where the first electrode 110 includes or is formed from a transparent conductive oxide (TCO), the first electrode 110 can have for example a layer thickness in a range of approximately 50 nm to approximately 500 nm, for example a layer thickness in a range of approximately 75 nm to approximately 250 nm, for example a layer thickness in a range of approximately 100 nm to approximately 150 nm.

Furthermore, for the case where the first electrode 110 is formed from, for example, a network composed of metallic nanowires, for example composed of Ag, which can be combined with conductive polymers, a network composed of carbon nanotubes which can be combined with conductive polymers, or from graphene layers and composites, the first electrode 110 can have for example a layer thickness in a range of approximately 1 nm to approximately 500 nm, for example a layer thickness in a range of approximately 10 nm to approximately 400 nm, for example a layer thickness in a range of approximately 40 nm to approximately 250 nm.

The first electrode 110 can be formed as an anode, that is to say as a hole-injecting electrode, or as a cathode, that is to say as an electron-injecting electrode.

The first electrode 110 can have a first electrical contact pad, to which a first electrical potential (provided by an energy source (not illustrated), for example a current source or a voltage source) can be applied. Alternatively, the first electrical potential can be applied to the carrier 102 and then be applied indirectly to the first electrode 110 via said carrier. The first electrical potential can be, for example, the ground potential or some other predefined reference potential.

Furthermore, the electrically active region 106 of the light emitting component 100 can have an organic functional layer structure 112, which is applied or formed on or above the first electrode 110.

The organic functional layer structure 112 may include one or a plurality of emitter layers 118, for example including fluorescent and/or phosphorescent emitters, and one or a plurality of hole-conducting layers 116 (also designated as hole transport layer(s) 120). In various embodiments, one or a plurality of electron-conducting layers 116 (also designated as electron transport layer(s) 116) can alternatively or additionally be provided.

Examples of emitter materials which can be used in the light emitting component 100 in accordance with various embodiments for the emitter layer(s) 118 include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl) iridium III), green phosphorescent Ir(ppy)$_3$ (tris(2-phenylpyridine)iridium III), red phosphorescent Ru (dtb-bpy)$_3$*2(PF$_6$) (tris[4,4'-di-tert-butyl-(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di(p-tolyflamino]anthracene) and red fluorescent DCM2 (4-dicyanomethylene)-2-methyl-6-julolidyl-9-enyl-4H-pyran) as non-polymeric emitters. Such non-polymeric emitters can be deposited by thermal evaporation, for example. Furthermore, it is possible to use polymer emitters, which can be deposited, for example, by a wet-chemical method such as spin coating, for example.

The emitter materials can be embedded in a matrix material in a suitable manner.

It should be pointed out that other suitable emitter materials are likewise provided in other embodiments.

The emitter materials of the emitter layer(s) 118 of the light emitting component 100 can be selected for example such that the light emitting component 100 emits white light. The emitter layer(s) 118 may include a plurality of emitter materials that emit in different colors (for example blue and yellow or blue, green and red); alternatively, the emitter layer(s) 118 can also be constructed from a plurality of partial layers, such as a blue fluorescent emitter layer 118 or blue phosphorescent emitter layer 118, a green phosphorescent emitter layer 118 and a red phosphorescent emitter layer 118. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary and secondary radiation.

The organic functional layer structure 112 may generally include one or a plurality of electroluminescent layers. The one or the plurality of electroluminescent layers may include organic polymers, organic oligomers, organic monomers, organic small, non-polymeric molecules ("small molecules") or a combination of these materials. By way of example, the organic functional layer structure 112 may include one or a plurality of electroluminescent layers embodied as a hole transport layer 120, so as to enable for example in the case of an OLED an effective hole injection into an electroluminescent layer or an electroluminescent region. Alternatively, in various embodiments, the organic functional layer structure 112 may include one or a plurality of functional layers embodied as an electron transport layer 116, so as to enable for example in an OLED an effective electron injection into an electroluminescent layer or an electroluminescent region. By way of example, tertiary amines, carbazole derivatives, conductive polyaniline or polyethylene dioxythiophene can be used as material for the hole transport layer 120. In various embodiments, the one or the plurality of electroluminescent layers can be embodied as an electroluminescent layer.

In various embodiments, the hole transport layer 120 can be applied, for example deposited, on or above the first electrode 110, and the emitter layer 118 can be applied, for example deposited, on or above the hole transport layer 120. In various embodiments, the electron transport layer 116 can be applied, for example deposited, on or above the emitter layer 118.

In various embodiments, the organic functional layer structure 112 (that is to say for example the sum of the thicknesses of hole transport layer(s) 120 and emitter layer(s) 118 and electron transport layer(s) 116) can have a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic functional layer structure 112 can have for example a stack of a plurality of organic light emitting diodes (OLEDs) arranged directly one above another, wherein each OLED can have for example a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic functional layer structure 112 can have for example a stack of two, three or four OLEDs arranged directly one above another, in which case for example the organic functional layer structure 112 can have a layer thickness of a maximum of approximately 3 µm.

The light emitting component 100 may optionally generally include further organic functional layers, for example arranged on or above the one or the plurality of emitter layers 118 or on or above the electron transport layer(s) 116, which serve to further improve the functionality and thus the efficiency of the light emitting component 100.

The second electrode 114 (for example in the form of a second electrode layer 114) can be applied on or above the organic functional layer structure 112 or, if appropriate, on or above the one or the plurality of further organic functional layer structures.

In various embodiments, the second electrode 114 may include or be formed from the same substances as the first electrode 110, metals being particularly suitable in various embodiments.

In various embodiments, the second electrode 114 (for example for the case of a metallic second electrode 114) can have for example a layer thickness of less than or equal to approximately 50 nm, for example a layer thickness of less than or equal to approximately 45 nm, for example a layer thickness of less than or equal to approximately 40 nm, for example a layer thickness of less than or equal to approximately 35 nm, for example a layer thickness of less than or equal to approximately 30 nm, for example a layer thickness of less than or equal to approximately 25 nm, for example a layer thickness of less than or equal to approximately 20 nm, for example a layer thickness of less than or equal to approximately 15 nm, for example a layer thickness of less than or equal to approximately 10 nm.

The second electrode 114 can generally be formed in a similar manner to the first electrode 110, or differently than the latter. In various embodiments, the second electrode 114 can be formed from one or more of the substances and with the respective layer thickness, as described above in connection with the first electrode 110. In various embodiments, both the first electrode 110 and the second electrode 114 are formed as translucent or transparent. Consequently, the light emitting component 100 illustrated in FIG. 1 can be designed as a top and bottom emitter (to put it another way as a transparent light emitting component 100).

The second electrode 114 can be formed as an anode, that is to say as a hole-injecting electrode, or as a cathode, that is to say as an electron-injecting electrode.

The second electrode 114 can have a second electrical terminal, to which a second electrical potential (which is different than the first electrical potential), provided by the energy source, can be applied. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

An encapsulation 108, for example in the form of a barrier thin-film layer/thin-film encapsulation 108, can optionally also be formed on or above the second electrode 114 and thus on or above the electrically active region 106.

In the context of this application, a "barrier thin-film layer" 108 or a "barrier thin film" 108 can be understood to mean, for example, a layer or a layer structure which is suitable for forming a barrier against chemical impurities or atmospheric substances, in particular against water (moisture) and oxygen. In other words, the barrier thin-film layer 108 is formed in such a way that OLED-damaging substances such as water, oxygen or solvent cannot penetrate through it or at most very small proportions of said substances can penetrate through it.

In accordance with one configuration, the barrier thin-film layer 108 can be formed as an individual layer (to put it another way, as a single layer). In accordance with an alternative configuration, the barrier thin-film layer 108 may include a plurality of partial layers formed one on top of another. In other words, in accordance with one configuration, the barrier thin-film layer 108 can be formed as a layer stack. The barrier thin-film layer 108 or one or a plurality of partial layers of the barrier thin-film layer 108 can be formed for example by a suitable deposition method, e.g. by an atomic layer deposition (ALD) method in accordance with one configuration, e.g. a plasma enhanced atomic layer deposition (PEALD) method or a plasmaless atomic layer deposition (PLALD) method, or by a chemical vapor deposition (CVD) method in accordance with another configuration, e.g. a plasma enhanced chemical vapor deposition (PECVD) method or a plasmaless chemical vapor deposition (PLCVD) method, or alternatively by other suitable deposition methods.

By using an atomic layer deposition (ALD) method, it is possible for very thin layers to be deposited. In particular, layers having layer thicknesses in the atomic layer range can be deposited.

In accordance with one configuration, in the case of a barrier thin-film layer 108 having a plurality of partial layers, all the partial layers can be formed by an atomic layer deposition method. A layer sequence including only ALD layers can also be designated as a "nanolaminate".

In accordance with an alternative configuration, in the case of a barrier thin-film layer 108 including a plurality of partial layers, one or a plurality of partial layers of the barrier thin-film layer 108 can be deposited by a different deposition method than an atomic layer deposition method, for example by a vapor deposition method.

In accordance with one configuration, the barrier thin-film layer 108 can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

In accordance with one configuration in which the barrier thin-film layer 108 includes a plurality of partial layers, all the partial layers can have the same layer thickness. In accordance with another configuration, the individual partial layers of the barrier thin-film layer 108 can have different layer thicknesses. In other words, at least one of the partial layers can have a different layer thickness than one or more other partial layers.

In accordance with one configuration, the barrier thin-film layer 108 or the individual partial layers of the barrier thin-film layer 108 can be formed as a translucent or transparent layer. In other words, the barrier thin-film layer 108 (or the individual partial layers of the barrier thin-film layer 108) can consist of a translucent or transparent substance (or a substance mixture that is translucent or transparent).

In accordance with one configuration, the barrier thin-film layer 108 or (in the case of a layer stack having a plurality of partial layers) one or a plurality of the partial layers of the barrier thin-film layer 108 may include or be formed of one of the following substances: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. In various embodiments, the barrier thin-film layer 108 or (in the case of a layer stack having a plurality of partial layers) one or a plurality of the partial layers of the barrier thin-film layer 108 may include one or a plurality of high refractive index materials, to put it another way one or a plurality of materials having a high refractive index, for example having a refractive index of at least 2.

In one configuration, the cover 126, for example composed of glass, can be applied for example by frit bonding (glass frit bonding/glass soldering/seal glass bonding) to the barrier thin-film layer 108 by a conventional glass solder in the geometrical edge regions of the organic optoelectronic component 100.

In various embodiments, on or above the barrier thin-film layer 108, it is possible to provide an adhesive and/or a protective lacquer 124, by which, for example, a cover 126 (for example a glass cover 126, a metal film cover 126, a sealed plastics film cover 126) is fixed, for example adhesively bonded, on the barrier thin-film layer 108. In various embodiments, the optically translucent layer composed of adhesive and/or protective lacquer 124 can have a layer thickness of greater than 1 µm, for example a layer thickness of several µm. In various embodiments, the adhesive may include or be a lamination adhesive.

In various embodiments, light-scattering particles can also be embedded into the layer of the adhesive (also designated as adhesive layer), which particles can lead to a further improvement in the color angle distortion and the coupling-out efficiency. In various embodiments, the light-scattering particles provided can be dielectric scattering particles, for example, such as metal oxides, for example, such as e.g. silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide, or titanium oxide. Other particles may also be suitable provided that they have a refractive index that is different than the effective refractive index of the matrix of the translucent layer structure, for example air bubbles, acrylate, or hollow glass beads. Furthermore, by way of example, metallic nanoparticles, metals such as gold, silver, iron nanoparticles, or the like can be provided as light-scattering particles.

In various embodiments, between the second electrode 114 and the layer composed of adhesive and/or protective lacquer 124, an electrically insulating layer (not shown) can also be applied, for example SiN, for example having a layer thickness in a range of approximately 300 nm to approximately 1.5 µm, for example having a layer thickness in a range of approximately 500 nm to approximately 1 µm, in order to protect electrically unstable materials, during a wet-chemical process for example.

In various embodiments, the adhesive can be designed in such a way that it itself has a refractive index which is less than the refractive index of the cover 126. Such an adhesive can be for example a low refractive index adhesive such as, for example, an acrylate which has a refractive index of approximately 1.3. In one configuration, an adhesive can be for example a high refractive index adhesive which includes for example high refractive index, non-scattering particles and has a mean refractive index corresponding approximately to the mean refractive index of the organic functional layer structure, for example in a range of approximately 1.7 to approximately 2.0. Furthermore, a plurality of different adhesives can be provided, which form an adhesive layer sequence.

Furthermore, it should be pointed out that, in various embodiments, an adhesive 124 can also be completely dispensed with, for example in configurations in which the cover 126, for example composed of glass, is applied to the barrier thin-film layer 108 by plasma spraying, for example.

In various embodiments, the cover 126 and/or the adhesive 124 can have a refractive index (for example at a wavelength of 633 nm) of 1.55.

Furthermore, in various embodiments, one or a plurality of antireflective layers (for example combined with the encapsulation 108, for example the barrier thin-film layer 108) can additionally be provided in the light emitting component 100.

The layers of the optoelectronic component 100 between the carrier 102 and the cover 126 can also be designated as thermal measurement region 130.

FIG. 2 shows a schematic cross-sectional view of an optoelectronic component, in accordance with various embodiments.

The schematic cross-sectional view in FIG. 2 illustrates one embodiment of an optoelectronic component in accordance with one of the configurations from the description of FIG. 1—identified by the excerpt 100 in the cross-sectional view 200.

The illustration shows: a first electrode 110 formed on or above a carrier 102. An organic functional layer structure 112 is formed on or above the first electrode 110. A second electrode 114 is formed above or on the organic functional layer structure 112. The second electrode 114 is electrically insulated from the first electrode 110 by an electrical insulation 204. The second electrode 114 can be physically and electrically connected to an electrical connection layer 202. The electrical connection layer 202 can be formed on or above the carrier 102 in the geometrical edge region of the carrier 102, for example laterally alongside the first electrode 110. The electrical connection layer 202 is electrically insulated from the first electrode 110 by a further electrical insulation 204. A barrier thin-film layer 108 is arranged on or above the second electrode 114 in such a way that the second electrode 114, the electrical insulations 204 and the organic functional layer structure 112 are surrounded by the barrier thin-film layer 108, that is to say are enclosed in a combination of the barrier thin-film layer 108 with the carrier 102. The barrier thin-film layer 108 can hermetically seal the enclosed layers with regard to harmful environmental influences. An adhesive layer 124 is arranged on or above the barrier thin-film layer 108 in such a way that the adhesive layer 124 areally and hermetically seals the barrier thin-film layer 108 with regard to harmful environmental influences. A cover 126 is arranged on or above the adhesive layer 124. The cover for example be adhesively bonded, for example be laminated, onto the barrier thin-film layer 108 by an adhesive 124.

Approximately the region of the optoelectronic component 100 with organic functional layer structure 112 on or above the carrier 102 can be designated as an optically active region 212. Approximately the region of the optoelectronic component 100 without an organic functional layer structure 112 on or above the carrier 102 can be designated as an optically inactive region 214. The optically inactive region 214 can be arranged for example in a planar fashion alongside the optically active region 212.

An optoelectronic component 100 embodied as at least translucent, for example transparent, for example including an at least translucent carrier 102, at least translucent electrodes 110, 114, an at least translucent organic functional layer system and an at least translucent barrier thin-film layer 108, may include for example two planar, optically active sides—the top side and the underside of the optoelectronic component 100 in the schematic cross-sectional view.

However, the optically active region 212 of an optoelectronic component 100 can also have only one optically active side and one optically inactive side, for example in the case of an optoelectronic component 100 designed as a top emitter or bottom emitter, for example by the second electrode 100 or the barrier thin-film layer 108 being embodied as reflective for electromagnetic radiation provided.

The carrier 102, the first electrode 110, the organic functional layer structure 112, the second electrode 114, the barrier thin-film layer 108, the adhesive layer 124 and the cover 126 can be designed for example in accordance with one of the configuration from the descriptions of FIG. 1.

The electrical insulations 204 are designed in such a way as to prevent a current flow between two electrically conductive regions, for example between the first electrode 110 and the second electrode 114. The substance or the substance mixture of the electrical insulation can be for example a covering or a coating agent, for example a polymer and/or a lacquer. The lacquer may include for example a coating substance that can be applied in liquid form or in pulverulent form, for example may include or be formed from a polyimide. The electrical insulations 204 can be applied or formed for example by a printing method, for example in a structured fashion. The printing method may include for example inkjet printing, screen printing and/or pad printing.

The electrical connection layer 202 may include or be formed from, as substance or substance mixture, a substance or a substance mixture similar to that of the electrodes 110, 114 in accordance with one of the configurations from the descriptions of FIG. 1.

The optically inactive region 214 can have for example contact pads 206, 208 for making electrical contact with the organic functional layer structure 112. In other words: in the geometrical edge region, the optoelectronic component 100 can be embodied in such a way that contact pads 206, 208 are formed for making electrical contact with the optoelectronic component 100, for example by electrically conductive layers, for example electrical connection layers 202, electrodes 110, 114 or the like, being at least partly exposed in the region of the contact pads 206, 208 (not illustrated).

A contact pad 206, 208 can be electrically and/or physically connected to an electrode 110, 114, for example by a connection layer 202. However, a contact pad 206, 208 can also be designed as a region of an electrode 110, 114 or of a connection layer 202.

The contact pads 206, 208 may include or be formed from, as substance or substance mixture, a substance or a substance mixture similar to that of the second electrode 114 in accordance with one of the configurations from the descriptions of FIG. 1, for example as a metal layer structure including at least one chromium layer and at least one aluminum layer, for example chromium-aluminum-chromium (Cr—Al—Cr).

Figure 3B:
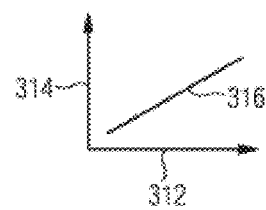
Figure 3C:
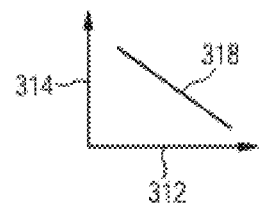

FIGS. 3A to 3C show schematic illustrations concerning an optoelectronic component apparatus, in accordance with various embodiments.

FIG. 3A shows a schematic circuit diagram of an optoelectronic component apparatus including a planar, optoelectronic component 308 and a thermoelectric component 302.

The optoelectronic component 308 can be formed in accordance with one of the configurations from the descriptions of FIG. 1 and/or FIG. 2, and electrical contact can be made with it by contact pads 206, 208.

Electrical contact can be made with the thermoelectrically sensitive section 302 of a thermoelectric component for measuring a temperature by a first contact pad 304 and a second contact pad 306. The contacts 304, 306 of the thermoelectrically sensitive section 302 can be arranged for example on one of the contact strips, for example a contact pad or a busbar, of the optoelectronic component. The contacts 304, 306 of the thermoelectrically sensitive section 302 can be electrically connected for example to a regulating input of the operating unit of the optoelectronic component.

In one embodiment, the thermoelectrically sensitive section 302 can be formed directly in the optoelectronic component, i.e. between the carrier 102 and the cover 126 and/or on the cover 126 or the carrier 102.

The thermoelectrically sensitive section 302 may include for example a substance or a substance mixture whose electrical conductivity changes with the temperature. The thermoelectrically sensitive section 302 can be formed for example in a structured fashion, for example before or after the application of the substance or the substance mixture of the thermoelectrically sensitive section, for example by a mask during a vapor deposition process and/or a laser ablation after application.

In one embodiment, the optoelectronic component 308 and the thermoelectric component can have a common contact pad (not illustrated), for example a grounded contact pad.

In one embodiment, the thermoelectric component can be formed as a temperature sensor and/or thermogenerator.

If, with the operating current of the optoelectronic component remaining constant, the voltage rises over the operating period, the power converted in the optoelectronic component also rises. Since, in the case of a component that provides radiation, for example, luminous efficiency decreases as a result, the extra power is converted into heat. In other words: with the operating conditions remaining constant, an OLED becomes hotter as the operating period increases. The thermoelectric component as temperature sensor therefore permits a conclusion to be drawn regarding the aging progress of the OLED. This conclusion can either be used directly for readjusting the current or else can be used in combination with other methods, for example the measurement of the light provided or a measurement of the voltage, for example for a countercheck as to whether, for example, the decrease measured by a light sensor is caused by the aging of the OLED or by ambient light.

Furthermore, fault cases which cause a significant heating of the optoelectronic component, for example short circuits (short), incidences of overheating (hotspot) and/or an operating current set too high, can be identified by the temperature sensor integrated in the component apparatus and the optoelectronic component can be switched off.

FIG. 3B shows a diagram illustrating the relationship 316 of the electrical resistance 314 of the thermoelectric component 302 as a function of the temperature 312 of the thermoelectric component 302.

In one embodiment, the thermoelectric component 302 can be formed in such a way that as the temperature 312 increases the electrical resistance of the thermoelectric component 302 rises, for example continuously monotonically, for example linearly (illustrated) or non-linearly, for example in a manner involving a power, for example with a positive or negative power, for example exponentially.

FIG. 3C shows a diagram illustrating the relationship 318 of the electrical resistance 314 of the thermoelectric component 302 as a function of the temperature 312 of the thermoelectric component 302.

In one embodiment, the thermoelectric component 302 can be formed in such a way that as the temperature 312 increases the electrical resistance of the thermoelectric component 302 falls, for example continuously monotonically, for example linearly (illustrated) or non-linearly, for example in a manner involving a power, for example with a positive or negative power, for example exponentially.

FIG. 4 shows a diagram of one method for producing an optoelectronic component apparatus, in accordance with various embodiments.

The method 400 may include providing 402 a substrate.

After providing 402 the substrate, the method 400 may include forming a thermoelectric component 404.

After forming the thermoelectric component 404, the method may include surrounding the thermoelectric component with an optoelectronic component and/or surrounding an optoelectronic component with the thermoelectric component.

Afterward, the method may include making electrical contact 408 with the thermoelectric component and the optoelectronic component.

Figure 5A:
FIGS. 5A and 5B show schematic cross-sectional views of a thermoelectric component in the method for producing an optoelectronic component apparatus, in accordance with various embodiments.
Figure 5B:
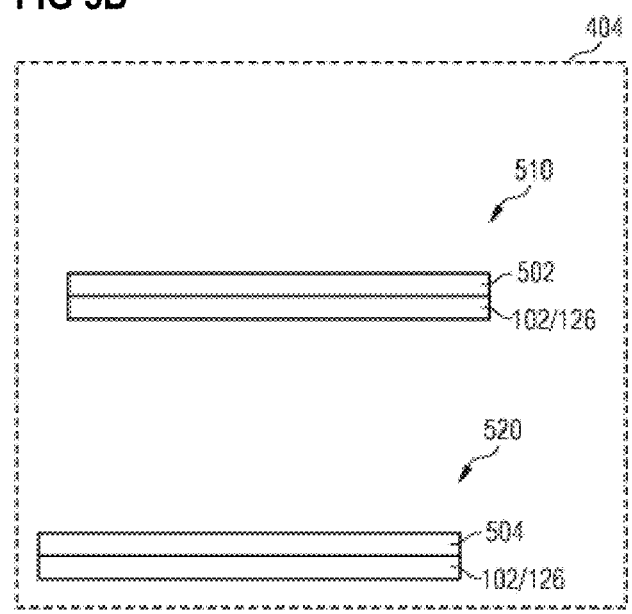

FIGS. 5A and 5B show schematic cross-sectional views of a thermoelectric component in the method for producing an optoelectronic component apparatus, in accordance with various embodiments.

FIG. 5A shows a schematic cross-sectional view of a provided (402) substrate of a thermoelectric component.

In one embodiment, the substrate can be designed as a carrier 102 and/or a cover 126 of an optoelectronic component in accordance with one of the configurations from the descriptions of FIG. 1, FIG. 2 and/or FIGS. 3A to 3C, for example a soda-lime glass.

FIG. 5B shows schematic cross-sectional views of a thermoelectric component during the process of forming 404 the thermoelectric component.

In one embodiment, forming 404 the thermoelectric component may include forming a thermoelectrically sensitive section preliminary stage 502—illustrated in view 510. A heat treatment and/or annealing (thermal anneal) of the thermoelectrically sensitive section preliminary stage 502 can lead to a thermoelectrically sensitive section 504—illustrated in view 520.

Figure 6A:
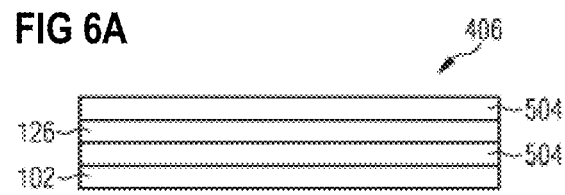
FIGS. 6A to 6C show schematic cross-sectional views of an optoelectronic component apparatus, in accordance with various embodiments.
Figure 6B:
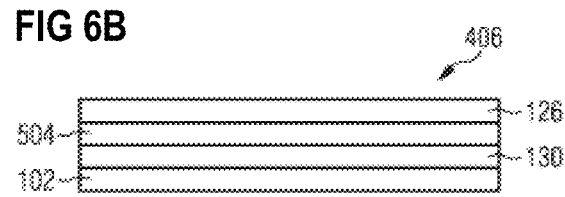
Figure 6C:
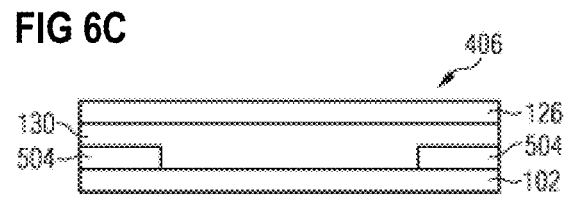

FIGS. 6A to 6C show schematic cross-sectional views of an optoelectronic component apparatus, in accordance with various embodiments.

The component apparatus described in FIGS. 3A to 3C, FIG. 4, FIGS. 5A and 5B can be formed for example by selecting suitable substances, substance mixtures and/or structures when producing the thermoelectrically sensitive section for example within the OLED, i.e. between cover 126 and carrier 102, for example below, above or alongside the organic functional layer structure 112, wherein the organic functional layer structure 112 has temperature-dependent, optoelectronic properties. In various embodiments, the thermoelectrically sensitive section can have for example a temperature-dependent resistance having a positive temperature coefficient (PTC) or having a negative temperature coefficient (NTC) and can be led out at separate contacts 304, 306 (not illustrated).

FIGS. 6A and 6B show embodiments of an optoelectronic component apparatus.

A thermal measurement region 130 can be formed on or above the carrier 102. The thermoelectrically sensitive section 504 of the thermoelectric component can be formed on or above the thermal measurement region 130. The thermoelectrically sensitive section 504 can be formed on or above a substrate, for example the cover 126 of the optoelectronic component in accordance with one configuration from the description of FIG. 1.

In one embodiment (illustrated in FIG. 6A), it is possible to arrangement the cover 126 with the thermoelectrically sensitive section 504 relative to the thermal measurement region 130 in such a way that the thermoelectrically sensitive section 504 faces the thermal measurement region 130.

In one embodiment (illustrated in FIG. 6B), it is possible to arrangement the cover 126 with the thermoelectrically sensitive section 504 relative to the thermal measurement region 130 in such a way that the thermoelectrically sensitive section 504 faces away from the thermal measurement region 130.

FIG. 6C shows a further embodiment of an optoelectronic component apparatus. The thermoelectrically sensitive section 504 can be formed on or above the carrier 102. The thermal measurement region 130 can be formed on or above the carrier and/or the thermoelectrically sensitive section 504.

In various configurations, the optoelectronic component apparatus may include at least two thermoelectrically sensitive sections 504. The individual thermoelectrically sensitive sections of the plurality of thermoelectrically sensitive sections can be arranged in a manner similar to the embodiments in FIGS. 6A to 6C.

Figure 7A:
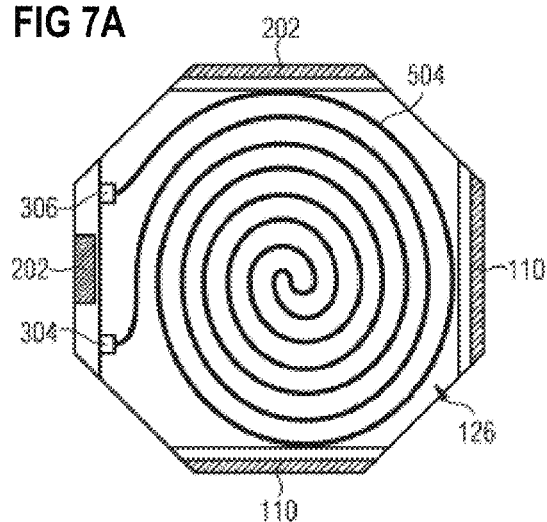
FIGS. 7A and 7B show schematic plan views of an optoelectronic component apparatus, in accordance with various embodiments.
Figure 7B:
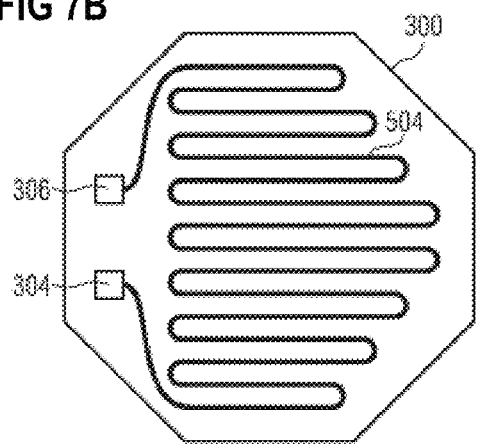

FIGS. 7A and 7B show schematic plan views of an optoelectronic component apparatus, in accordance with various embodiments.

In one embodiment, the thermoelectrically sensitive section can be formed as a long, thin conductor track structure composed of a substance or substance mixture having NTC or PTC behavior. In one configuration, the long, thin conductor track structure can be formed as a polygon progression distributed over the optically active region 212.

In one embodiment, the conductor track structure can have a thickness or height in a range of approximately 5 μm to approximately 25 μm.

In one embodiment, the conductor track structure can have an arbitrary width and/or length.

In one embodiment, the conductor track structure can have a width in a range of approximately 1 mm to approximately 10 mm.

In one embodiment, the conductor track structure can have a length in a range of approximately 10 mm to approximately 1000 mm.

In one embodiment, the conductor track structure may include or be formed from a substance having NTC or PTC temperature behavior.

In one embodiment, the conductor track structure can be formed at a temperature of less than approximately 500° C., for example wet-chemically, for example from a paste and/or solution. The carrier of the thermoelectrically sensitive section can otherwise soften above said temperature.

FIG. 7A shows one embodiment of an optoelectronic component apparatus including a thermoelectrically sensitive section 302/504 and an optoelectronic component. The optoelectronic component illustrated has four contact pads 206, 208 for energizing the electrically active region 106—in accordance with the description of FIG. 2. The thermoelectrically sensitive section 302, 504 is electrically connected to two contact pads 304, 306, thereby enabling electrical contact to be made with the thermoelectrically sensitive section 302/504. The thermoelectrically sensitive section 302/504 can be formed on or above the cover 126. The thermoelectrically sensitive section 302/504 can be formed as a polygon progression in a spiral fashion (illustrated), as a result of which a measurable area is spanned which is approximately identical or similar to the optically active region 212 of the optoelectronic component 200.

FIG. 7B shows, in a manner similar to FIG. 7B, an optoelectronic component apparatus including a thermoelectrically sensitive section 302/504 and an optoelectronic component. FIG. 7B shows a thermoelectrically sensitive section 302/504 which is formed in a folded fashion or in a fan-shaped fashion on, above or below the optoelectronic component.

In various configurations, an optoelectronic component apparatus, a method for producing an optoelectronic component apparatus and a method for operating an optoelectronic component apparatus are provided which make it possible to couple a temperature sensor to the heat generating layer(s) of an OLED over a large area, in direct proximity within an OLED. In other words: the temperature of an OLED can be measured directly in the interior. As a result, the accuracy of the measurement can be significantly increased, the external appearance of an optoelectronic component not being altered, for example by virtue of no raised sensors being applied.

The arrangement of the thermoelectrically sensitive section and of the optoelectronic component enables a simple integration of a temperature measuring device in an existing production process for an optoelectronic component. In other words: no separate, manual, cost- and time-intensive placement process is required for the sensor. The formation of the temperature sensor, i.e. the "incorporation", can be carried out by the same or only slightly modified installations and/or processes as those for the OLED layers themselves.

By the integration of the temperature measuring device into the optoelectronic component, it is possible, for example, to adapt the power output of the module drivers to the temperature of the optoelectronic component and thus to compensate for luminance fluctuations on account of temperature fluctuations or aging. The possibility of temperature measurement on the inside of the optoelectronic component, i.e. at the surface of the carrier, in combination with further temperature measurements on the outside, i.e. the surface of the optoelectronic component, makes it possible to determine the heat transfer of the optoelectronic component to the surroundings. Furthermore, the component apparatus makes it possible to measure the temperature of an OLED without influencing the heat transfer coefficient.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component apparatus, comprising:
   a carrier, an optoelectronic component and a thermoelectric component on or above the carrier;
   wherein the optoelectronic component has a planar, optically active region;
   wherein the thermoelectric component has at least one thermoelectrically sensitive section;
   wherein the thermoelectrically sensitive section has a first electrical conductivity at a first temperature and a second electrical conductivity at a second temperature; and
   wherein the thermoelectrically sensitive section is thermally connected to the optoelectronic component in a planar fashion; and
   wherein the thermoelectric component is formed as a temperature sensor and/or thermogenerator, and the thermoelectrically sensitive section is formed as a conductor track structure, wherein the conductor track structure has a height in a range of approximately 5 μm to approximately 25 μm.

2. The optoelectronic component apparatus as claimed in claim 1,
   wherein the optoelectronic component has an optically active region and an optically inactive region, wherein the optically active region is formed in a planar fashion.

3. The optoelectronic component apparatus as claimed in claim 1,
   wherein the thermoelectrically sensitive section is formed as a polygon progression.

4. The optoelectronic component apparatus as claimed in claim 3,
   wherein the polygon progression is formed in such a way that the thermoelectrically sensitive section spans a planar, thermoelectrically sensitive area.

5. The optoelectronic component apparatus as claimed in claim 4,
   wherein the polygon progression in the thermoelectrically sensitive area at least partly has a geometrical shape from the group of the following shapes: a spiral, a meander, a fan.

6. The optoelectronic component apparatus as claimed in claim 4,
   wherein the planar dimension of the thermoelectrically sensitive area is greater than approximately half of the planar dimension of the optically active region.

7. The optoelectronic component apparatus as claimed in claim 1,
   wherein the optoelectronic component apparatus is designed in such a way that the thermoelectric component and the optoelectronic component have a common contact pad.

8. The optoelectronic component apparatus as claimed in claim 1,
   wherein the optoelectronic component is designed as an organic light emitting diode or an organic solar cell.

9. The optoelectronic component apparatus as claimed in claim 1,
   wherein the optoelectronic component apparatus is designed as a temperature-regulated optoelectronic component.

10. A method for producing an optoelectronic component apparatus, the method comprising:
    forming an optoelectronic component; and
    forming a thermoelectric component;
    wherein forming the thermoelectric component comprises forming a first contact pad, forming a second contact pad and forming at least one thermoelectrically sensitive section,
    wherein the thermoelectrically sensitive section is formed in such a way that the first contact pad is electrically connected to the second electrical contact pad; and
    that the thermoelectric sensitive section at least partly surrounds the optoelectronic component; and
    wherein the thermoelectrically sensitive section is formed as a conductor track structure wet-chemically wherein the conductor track structure has a height in a range of approximately 5 μm to approximately 25 μm.

11. The method as claimed in claim 10,
    wherein forming the optoelectronic component comprises forming an optically active region and forming an optically inactive region.

12. The method as claimed in claim 11,
    wherein the optically active region is formed in a planar fashion.

13. The method as claimed in claim 10,
wherein at least the thermoelectrically sensitive section is cohesively connected to at least one region of the optoelectronic component.

14. The method as claimed in claim 10,
wherein the optoelectronic component apparatus is designed in such a way that the thermoelectric component and the optoelectronic component have a common contact pad.

15. A method for operating an optoelectronic component apparatus, the method comprising:
  determining an average surface temperature of a planar, optoelectronic component;
  correlating the determined average surface temperature with a further, optoelectronic property of the optoelectronic component apparatus; and
  changing at least one optoelectronic property of the optoelectronic component;
  wherein the at least one optoelectronic property are changed in such a way that the surface temperature of the optoelectronic component is altered from a first temperature value toward a second temperature value.

* * * * *

UNITED STATES PATENT AND TRADEMARK OFFICE
CERTIFICATE OF CORRECTION

PATENT NO. : 9,451,670 B2
APPLICATION NO. : 14/431780
DATED : September 20, 2016
INVENTOR(S) : Andrew Ingle et al.

It is certified that error appears in the above-identified patent and that said Letters Patent is hereby corrected as shown below:

IN THE SPECIFICATION

Column 9, line 1: Please delete "$Mg_2B^1v$" between the words "example" and "where", and write "$Mg_2B^{IV}$" in place thereof.

Signed and Sealed this
Sixth Day of December, 2016

Michelle K. Lee
*Director of the United States Patent and Trademark Office*